(12) United States Patent
Yamazaki et al.

(10) Patent No.: US 6,852,653 B2
(45) Date of Patent: Feb. 8, 2005

(54) METHOD OF MANUFACTURING SEMICONDUCTOR SUBSTRATE, SEMICONDUCTOR SUBSTRATE, ELECTRO-OPTICAL APPARATUS AND ELECTRONIC EQUIPMENT

(75) Inventors: Yasushi Yamazaki, Suwa (JP); Yukiya Hirabayashi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/970,766

(22) Filed: Oct. 5, 2001

(65) Prior Publication Data

US 2002/0047159 A1 Apr. 25, 2002

(30) Foreign Application Priority Data

Oct. 16, 2000 (JP) ........................................ 2000-315822

(51) Int. Cl.[7] ........................ H01L 21/30; H01L 21/46; H01L 21/20; H01L 21/36
(52) U.S. Cl. ...................... 438/978; 438/455; 438/479; 438/977
(58) Field of Search ................................. 438/455, 457, 438/458, 459, 464, 479, 517, 149, 976–979

(56) References Cited

U.S. PATENT DOCUMENTS

| 4,861,424 A | * | 8/1989 | Fujimura et al. ............. 216/67 |
| 5,374,564 A | | 12/1994 | Bruel |
| 5,494,835 A | * | 2/1996 | Bruel ......................... 438/464 |
| 5,591,654 A | * | 1/1997 | Kishimura ................... 438/526 |
| 5,656,825 A | | 8/1997 | Kusumoto et al. |
| 5,882,987 A | | 3/1999 | Srikrishnan |
| 6,027,988 A | | 2/2000 | Cheung et al. |
| 6,054,370 A | * | 4/2000 | Doyle ......................... 438/456 |
| 6,087,230 A | | 7/2000 | Kishi |
| 6,271,101 B1 | * | 8/2001 | Fukunaga .................... 438/455 |
| 6,288,412 B1 | | 9/2001 | Hamada et al. |
| 6,417,031 B2 | | 7/2002 | Ohtani et al. |
| 6,495,898 B1 | | 12/2002 | Iwamatsu et al. |
| 6,509,602 B2 | | 1/2003 | Yamazaki et al. |
| 6,552,362 B2 | | 4/2003 | Ohtani et al. |

FOREIGN PATENT DOCUMENTS

| JP | 4-25114 | * | 1/1992 | ......... H01L/21/027 |
| JP | A-4-346418 | | 12/1992 | |
| JP | 5-313195 | * | 11/1993 | ........... G02F/1/136 |

* cited by examiner

*Primary Examiner*—Shouxiang Hu
(74) *Attorney, Agent, or Firm*—Oliff & Berridge, PLC

(57) ABSTRACT

A method of manufacturing a semiconductor substrate (7) includes the processes of: forming an insulation film (2) on a surface of a semiconductor substrate main body (1); forming an ion shield member (3) having a predetermined shape on the insulation film; implanting an ion into the semiconductor substrate main body from a side on which the insulation film is formed, to thereby form an ion implantation layer (1a, 1b); removing the ion shield member; laminating the insulation film and a support substrate (5) onto each other; and separating the semiconductor substrate main body from the support substrate at a portion of the ion implantation layer.

5 Claims, 7 Drawing Sheets

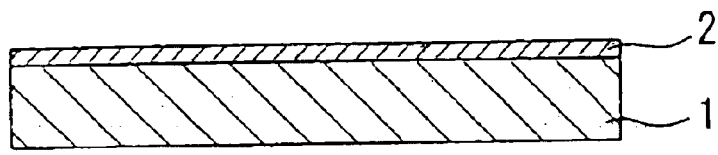
FIG.1A
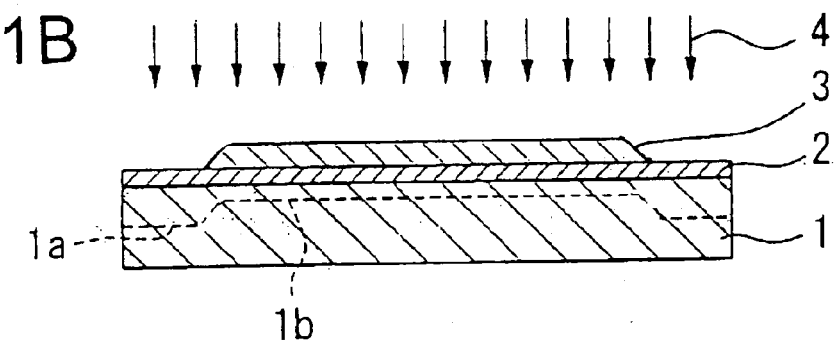
FIG.1B
FIG.1C
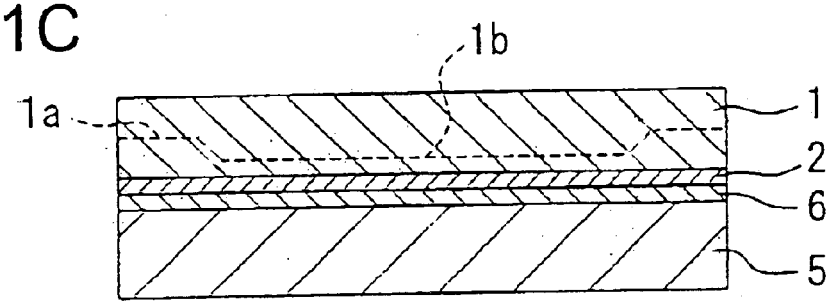
FIG.1D
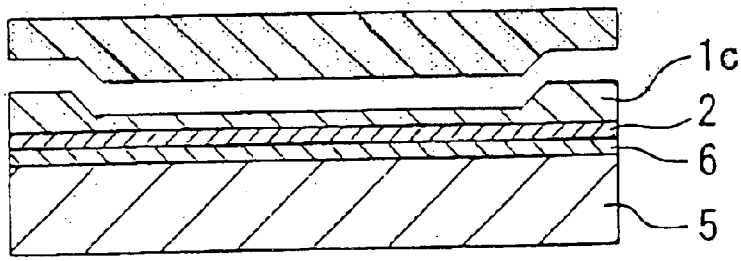
FIG.1E
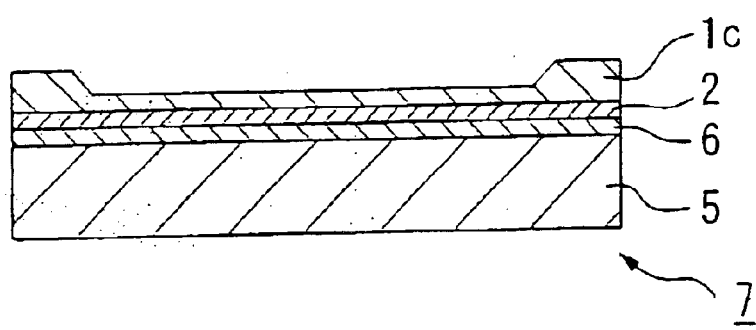

METHOD OF MANUFACTURING SEMICONDUCTOR SUBSTRATE, SEMICONDUCTOR SUBSTRATE, ELECTRO-OPTICAL APPARATUS AND ELECTRONIC EQUIPMENT

BACKGROUND OF THE INVENTION

1. Field of the Invention

The present invention relates to a technique for manufacturing a semiconductor substrate having an SOI (Silicon On Insulator) structure, and more particularly relates to a semiconductor substrate suitable for a usage in an electro-optical apparatus, and a method of manufacturing the same.

2. Description of the Related Art

The SOI technique using a silicon layer made on an insulator layer for a formation of a semiconductor device has been developed in order to make the integration degree of the semiconductor device higher, since it has excellent properties that cannot be achieved by a typical silicon substrate, such as an alpha-ray resistance, a latch-up property, a depression effect of a short channel or the like.

Recently, an excellent short channel depression effect is found out from a sample in which a device is formed on an SOI layer whose film thickness is reduced to 100 nm or less. Also, the thus-formed SOI device can have a high reliability resulting from an excellent radiation resistance and attain a high speed of an element resulting from a decrease in parasitic capacitance and a low consumption power, or make a hyperfine process rule resulting from a formation of a perfectly depleted electric field effect transistor.

As one of such SOI techniques, there is a technique of manufacturing an SOI substrate in which a single crystal silicon substrate is laminated. In this technique typically referred to as a laminating method, the single crystal silicon substrate and a support substrate are laminated to each other by using hydrogen bonding force. Then, the lamination strength is increased by a thermal process, and the film thickness of the single crystal silicon substrate is reduced by grinding, polishing, or etching. Accordingly, the single crystal silicon layer is formed on the support substrate. In this technique, the film thickness of the single crystal silicon substrate is directly reduced. Thus, it is possible to manufacture the device having the excellent crystal property of the silicon thin film and the high performance.

Also, as the application techniques of this lamination method, there are a method of implanting hydrogen ions into a single crystal silicon substrate, and laminating it onto a support substrate, and then separating a thin film silicon layer from the hydrogen implantation region of the single crystal silicon substrate by a thermal process (U.S. Pat. No. 5,374,564), and a method of epitaxially growing a single crystal silicon layer on a silicon substrate whose surface is made porous, and laminating it onto a support substrate, and then removing the silicon substrate, and etching the porous silicon layer, and accordingly forming the epitaxial single crystal silicon thin film on the support substrate (Japanese Patent Application Laid Open (JP-A-Heisei, 4-346418)) and the like.

The SOI substrate according to such a lamination method is used to manufacture various devices, similarly to a typical bulk semiconductor substrate (i.e., a semiconductor integrated circuit). However, as the difference from the conventional bulk substrate, it can be cited that various materials can be used for the support substrate. That is, as the support substrate, it is possible to use not only the typical silicon substrate but also a transparent quartz, a glass substrate or the like. As a result, for example, by forming a single crystal silicon thin film on a transparent substrate, it is possible to form an high performance transistor element by using a single crystal silicon with an excellent crystal performance, even in an electro-optical apparatus, such as a device requiring an optical transparency, for example, a transparent type of a liquid crystal display device and the like.

By the way, the usage of the above-mentioned SOI substrate in a liquid crystal apparatus enables the device formation process to be applied to the single crystal semiconductor substrate. That is, since a TFT (Thin Film Transistor) for driving a pixel electrode and a drive circuit around a display are formed on an SOI layer that is the single crystal semiconductor layer, it is possible to provide the display having a hyperfine structure and a high speed.

In the SOI substrate used in such a liquid crystal apparatus, a single crystal semiconductor layer in a region in which a pixel is formed is desired to be extremely thin in order to suppress a light leak current. On the other hand, in a region in which a drive circuit around the pixel formation region is formed, it is necessary to form a drive circuit to be driven at a high speed. Thus, it is desired that a sheet resistance is small. Hence, it is advantageous to make the single crystal semiconductor layer thicker.

However, the manufacturing method disclosed in the above-mentioned gazette can manufacture only the semiconductor substrate having a single crystal semiconductor layer of a certain thickness. For example, trying to form a single crystal semiconductor layer at a thickness of 100 nm or less that is required of a pixel formation region makes the formation of a peripheral drive circuit very difficult. On the contrary, if the whole portion is formed at a thickness of about 200 nm in order to easily form a drive circuit, it is necessary to again reduce the film thickness of the single crystal semiconductor layer in the pixel formation region. Thus, this reduction in the film thickness needs an extremely high control technique.

SUMMARY OF THE INVENTION

The present invention is proposed in view of the above mentioned problems. It is therefore an object of the present invention to provide a method of manufacturing a semiconductor substrate containing a semiconductor layer having partially different thicknesses, in a semiconductor substrate having an SOI structure.

Another object of the present invention is to provide an electro-optical apparatus produced by forming a pixel and a drive circuit on the above-mentioned semiconductor substrate.

The above object of the present invention can be achieved by a method of manufacturing a semiconductor substrate including the processes of: forming an insulation film on at least a surface of a semiconductor substrate main body; forming an ion shield member having a predetermined shape on the insulation film; implanting ions into the semiconductor substrate main body from a side on which the insulation film is formed, to thereby form an ion implantation layer; removing the ion shield member; laminating the insulation film and a support substrate onto each other; and separating the semiconductor substrate main body from the support substrate at a portion of the ion implantation layer.

According to the manufacturing method of the present invention, it is possible to control the depth of implantation of the implanted ion in the semiconductor substrate main body, by the shape and the thickness of the ion shield member. Namely, since the depth and the shape of the ion implantation layer formed in the semiconductor substrate main body, it is possible to form the semiconductor layer by separating it at the ion implantation layer so that the thicknesses of the semiconductor layer may be different in the layer thereof.

Conventionally, in order to make the thicknesses of the semiconductor layer in the layer thereof, it is necessary to form a thin portion later by etching the semiconductor layer whose thickness is originally constant. In contrast, according to the manufacturing method of the present invention, it is possible to form the portions within the semiconductor layer, whose thicknesses are different from each other in the layer, at one time with an arbitrary thickness and at an arbitrary position. As a result, a process of adjusting the thickness of the semiconductor layer is not required in the semiconductor device manufacturing processes, so that the processes can be simplified.

Further, a process of forming specific one portion of the semiconductor layer at a thickness of 100 nm or less after forming the semiconductor layer having a constant thickness requires an extremely highly sophisticated control of the film thickness, resulting in that variation of the film thickness tends to be generated. However, according to the manufacturing method of the present invention, since the portions whose thicknesses are different from each other can be formed at one time, variation of the film thickness is hardly generated. As a result, it is possible to make the management of the processes easy, and the manufacturing yield can be improved.

In one aspect of the method of manufacturing a semiconductor substrate of the present invention, the process of separating the semiconductor substrate main body at the portion of the ion implantation layer comprises the process of separating the semiconductor substrate main body at a peak position of an ion concentration in the ion implantation layer.

According to this aspect, in the distribution of the ion concentration formed within the semiconductor substrate main body by the ion implanting process, since the semiconductor substrate main body is separated at the peak position of the ion concentration, it is possible to precisely determine the position of separation. By this, it is possible to more precisely control the layer thickness of the semiconductor layer formed on the support substrate.

In another aspect of the method of manufacturing a semiconductor substrate of the present invention, the process of forming the ion shield member comprises the processes of: forming an ion shield film made of resist or oxide film on the insulation film; and patterning the ion shield film to a predetermined shape to thereby form the ion shield member.

According to this aspect, since the ion can be shielded effectively by using the above described materials of the ion shield member, even if the ion shield member has a complicated shape, it is still possible to form the ion implantation layer corresponding to the complicated shape, within the semiconductor substrate main body. Thus, it is possible to make the semiconductor layer having the complicated shape.

In another aspect of the method of manufacturing a semiconductor substrate of the present invention, a shape of an outer edge of the ion shield member is tapered toward an outermost edge thereof.

According to this aspect, it is possible to constitute the shape of the boundary, at which the depth of the ion implantation layer changes, not by the vertical step difference but by such a shape that the depth changes by a certain inclination angle.

Namely, if the outer edge of the ion shield member is made in the vertical step difference, the ion implantation layer within the semiconductor substrate main body also has such a vertical step difference, resulting in that the portion of the semiconductor substrate main body at the this vertical step difference may not be separated properly but may become defective, in the process of separating the semiconductor substrate main body. However, according to the present invention in this aspect, it is possible to make the separation of the semiconductor substrate main body easy at this step difference by virtue of the above described structure, so that it is possible to prevent the separation defect of the semiconductor substrate main body.

In another aspect of the method of manufacturing a semiconductor substrate of the present invention, the semiconductor substrate main body comprises single crystal silicon.

According to this aspect, since the semiconductor layer becomes the single crystal silicon, if the channel of the transistor is formed in this single crystal silicon, it is possible to manufacture a silicon transistor whose transistor performance is superior. In addition, other than the single crystal silicon, single crystal germanium or the like may be used for the single crystal semiconductor layer.

In another aspect of the method of manufacturing a semiconductor substrate of the present invention, the support substrate comprises an optically transparent material.

According to this embodiment, since the support substrate has the optically transparent property, it is possible to manufacture the semiconductor device by using the semiconductor layer formed on the support substrate having the optically transparent property, which is different from the case of using the conventional silicon substrate. For example, an adaptation for manufacturing various electro-optical apparatuses in which the semiconductor device is formed in a region other than a predetermined region, where the light passes through, of the support substrate becomes possible. Therefore, the usage to which the present invention can be adapted is expanded.

In this aspect, the optically transparent material may comprise glass.

By constructing in this manner, since the substrate comprising glass is used as the support substrate, it is possible to apply the present invention to such a relatively inexpensive and general device such as a liquid crystal panel or the like.

Alternatively, in this aspect, the optically transparent material may comprise quartz.

By constructing in this manner, since the substrate comprising quartz glass is used as the support substrate, it is possible to improve the heat resistance property of the support substrate, so that it becomes possible to perform a high temperature process after laminating the semiconductor substrate and the support substrate onto each other, such as a heat process at a high temperature in the device process with respect to the semiconductor layer. For example, by applying processes such as a heat or annealing process to improve the performance of the semiconductor device such as a TFT etc., a formation process of the thermal oxide film, a high temperature annealing process and the like, it is possible to form a semiconductor device having an excellent performance on the semiconductor substrate.

In another aspect of the method of manufacturing a semiconductor substrate of the present invention, a thermally conductive film is buried in the support substrate used in the laminating process.

According to this aspect, the heat can conduct through the thermally conductive film buried in the support substrate, so that the temperature increase of the semiconductor substrate can be restrained.

The above object of the present invention can be also achieved by a semiconductor substrate comprising: a support substrate; an insulation film laminated on a surface of the support substrate; and a semiconductor layer formed on the insulation film, the semiconductor layer having such a structure that thicknesses of the semiconductor layer are different in a layer thereof.

According to the semiconductor substrate of the present invention, since it has the structure that the thicknesses of the semiconductor layer are different in the layer thereof, such a design becomes possible that, among semiconductor devices formed of the semiconductor layer, a semiconductor device which is driven at a high frequency by a large electric current is formed in a region where the semiconductor layer is thick, while a semiconductor device which is driven at a low voltage is formed in a region where the semiconductor layer is thin, for example. Namely, since it is possible to give an optimum thickness of the semiconductor layer to each semiconductor device formed of the semiconductor layer, it is possible to make the best use of the property of the semiconductor device formed of the semiconductor layer In one aspect of the semiconductor substrate of the present invention, the semiconductor layer comprises a single crystal semiconductor layer.

According to this aspect, since it is possible to give an optimum thickness of the single crystal semiconductor layer, it is possible to make the best use of the property of the semiconductor device formed of the single crystal semiconductor layer.

The above object of the present invention can be also achieved by an electro-optical apparatus comprising a pair of a support substrate and an opposite substrate sandwiching electro-optical substance therebetween; a plurality of first switching elements arranged in a form of matrix in correspondence with a pixel array, in an image display region of the support substrate; and a plurality of second switching elements arranged in a peripheral region, which is located around the image display region, of the support substrate and at least partially constituting a peripheral circuit, wherein a thickness of a semiconductor layer in the image display region constituting the first switching elements is thinner than a semiconductor layer in the peripheral region constituting the second switching elements.

According to the electro-optical apparatus of the present invention, since the thickness of the semiconductor layer in the image display region is thinner than that in the peripheral region, it is possible to restrain the leak current generated by the photoelectric effect due to the input of the light as for the first switching element formed in the image display region. It is also possible to reduce the sheet resistance of the semiconductor layer as for the peripheral region, so that it is possible to form the second switching element whose performance is hardly degraded even under a large electric current driving and/or high frequency driving condition. Thus, the reliability of the electro-optical apparatus can be improved.

In one aspect of the electro-optical apparatus of the present invention, the semiconductor layer comprises a single crystal semiconductor layer.

According to this aspect, it is also possible to reduce the sheet resistance of the single crystal semiconductor layer as for the peripheral region, so that it is possible to form the second switching element whose performance is hardly degraded even under a large electric current driving and/or high frequency driving condition.

In another aspect of the electro-optical apparatus of the present invention, the peripheral circuit is a drive circuit.

According to this aspect, the peripheral circuit is a drive circuit such as a scanning line driving circuit, a data line driving circuit or the like. Thus, since the second switching element constituting this drive circuit is driven by a large electric power driving and/or high frequency driving operation, the effect of the present invention that the sheet resistance of the peripheral circuit is reduced can be quite effective.

The above object of the present invention can be also achieved by an electronic equipment comprising a light source for outputting a light, the above described electro-optical apparatus of the present invention for modulating the outputted light in correspondence with image information and a projecting device for projecting the modulated light.

According to the electronic equipment of the present invention, since it is provided with the above mentioned electro-optical apparatus of the present invention, a highly fine display is possible in the image display region, the reliability is superior since the light leak current is restrained, and the peripheral circuit in the peripheral region can be stably driven at a large electric current driving and/or high frequency driving operation. As a result, an electronic equipment, which can perform an image display with a high quality and whose reliability is certainly high, can be realized.

In one aspect of the electronic equipment of the present invention, the semiconductor layer comprises a single crystal semiconductor layer.

According to this aspect, it is also possible to reduce the sheet resistance of the single crystal semiconductor layer, so that it is possible to form the switching element whose performance is hardly degraded even under a large electric current driving and/or high frequency driving condition.

The nature, utility, and further features of this invention will be more clearly apparent from the following detailed description with respect to preferred embodiments of the invention when read in conjunction with the accompanying drawings briefly described below.

BRIEF DESCRIPTION OF THE DRAWINGS

FIGS. 1A to 1E are sectional configuration views showing a process of manufacturing a semiconductor substrate according to the present invention;

DETAILED DESCRIPTION OF THE PREFERRED EMBODIMENTS

Figure 2:
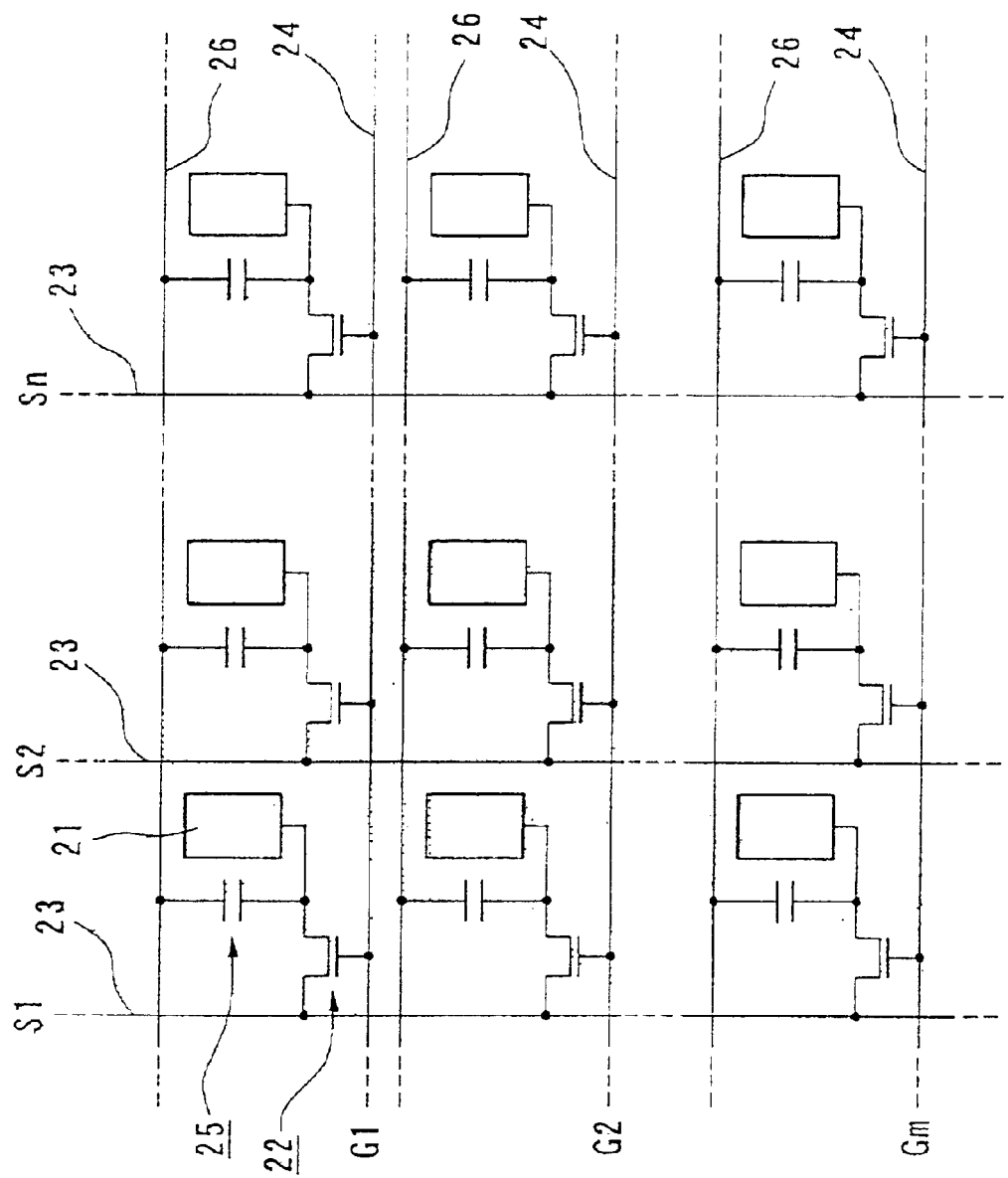
FIG. 2 is an equivalent circuit diagram of a liquid crystal apparatus according to the present invention.

Embodiments of the present invention will be explained below with reference to the accompanying drawings.
(Method of Manufacturing Semiconductor Substrate)

FIGS. 1A to 1E are sectional views each showing part of a process of manufacturing a semiconductor substrate which is an embodiment of the present invention. The process is carried out in the order of FIGS. 1A to 1E.

At first, as shown in FIG. 1A, an insulation film 2 is formed on a semiconductor substrate 1. A method of forming the insulation film 2 is not particularly limited. Various methods may be used such as a method of thermally oxidizing the surface of the semiconductor substrate 1, a method of forming an oxide layer on the semiconductor substrate 1 by using a CVD method, or the like. Preferably, the insulation film 2 may have a thickness of about 400 nm to 800 nm if the semiconductor substrate 1 is, for example, a silicon substrate having a thickness of about 300 $\mu$m to 900 $\mu$m.

Next, as shown in FIG. 1B, an ion shield member 3 is formed in a predetermined region on the surface of the insulation film 2. As materials that can be used for the ion shield member 3, there are a resist, a metal and its oxide, or a metallic silicide and the like. The optimal material is selected on the basis of the kind of ions that are implanted from the side of the insulation film 2 at a process described later, and the thickness of a targeted single crystal semiconductor layer, and the like. The material or materials for the ion shield member 3 may be used singly or in combination. Also, as the method of forming the ion shield member 3, various methods may be used such as a method of selectively forming the resist by a lithography technique and using it as the ion shield member, a method of using the lithography technique and a dry etching technique, and selectively forming a metallic film, such as W, Al and the like, an oxide film, a metallic silicide film and the like, and then using it as the ion shield member 3.

Also, even the thickness of the ion shield member 3 may be different depending upon the material of the ion shield member 3, or the thickness of the targeted single crystal semiconductor layer, or the like. Specifically, when a silicon oxide film is used, for example, as the material of the ion shield member 3 and a hydrogen ion is used, for example, as the implantation ion, and if the thickness of the ion shield member 3 is about 150 nm, then it is possible to manufacture a semiconductor substrate of a structure having a concave portion with a depth of about 150 nm within the single crystal semiconductor layer having a thickness of about 200 nm, as described later.

Next, as shown in FIG. 1B, ions 4 are implanted from the side of the ion shield member 3 into the semiconductor substrate 1 on which the insulation layer 2 has been formed. At this time, the ions 4 implanted through the ion shield member 3 are decelerated by the ion shield member 3. Thus, their penetration depth into the semiconductor substrate 1 is smaller as compared with the ions 4 implanted into the semiconductor substrate 1 without passing through the ion shield member 3. This action causes the ion implantation layer having the penetration depth distribution corresponding to the shape of the ion shield member 3 to be formed within the semiconductor substrate 1, as shown by a dotted line of FIG. 1B. That is, a shallow ion implantation layer 1$b$ is formed on the thicker portion of the ion shield member 3 placed on the insulation film 2, and a deep ion implantation layer 1$a$ is formed on the thinner portion of the ion shield member 3 or the portion where the ion shield member 3 is not formed.

As the ion implantation condition at this time, for example, an acceleration energy is 100 keV, and a dose amount is $5 \times 10^{16}$ cm$^{-2}$ to $10 \times 10^{16}$ cm$^{-2}$. Specifically, in cases where the single crystal silicon substrate is used as the semiconductor substrate 1, the silicon oxide film having the thickness of 150 nm is used as the ion shield member 3, and the thickness of the single crystal semiconductor layer formed in the portion into which the ions are implanted through the ion shield member 3 is 50 nm, the acceleration energy may be set to 100 keV and the dose amount to about $10 \times 10^{16}$ cm$^{-2}$.

The above-mentioned ion implantation condition is cited as an example. So, it is needless to say that the optimal condition can be selected depending upon the thickness of the single crystal semiconductor layer to be manufactured, the material of the ion shield member 3 and the like.

The ion shield member 3 placed on the side of the insulation film 2 is removed by a known process such as etching and the like. Also, preferably the surface of the insulation film 2 after the removal of the ion shield member 3 may be cleaned and/or smoothed by a CMP (Chemical Mechanical Polishing) process and the like.

Next, as shown in FIG. 1C, the semiconductor substrate 1 and the member in which an insulation film 6 has been formed on one surface of a support substrate 5 by the CVD method, the thermally oxidizing method and the like are laminated onto each other so that the insulation film 2 and the insulation film 6 becomes a junction plane. By the way, this insulation film 6 is placed so as to ensure the adhesion between the semiconductor substrate 1 and the support substrate 5. So, the insulation film 6 may be formed on one surface of the support substrate 5, as the occasion demands. The material made of silicon, glass, quartz glass or the like may be used for the support substrate 5. It may be a substrate having flexibility depending on a condition. If a substrate made of light transmission material such as glass, quartz glass and the like is used as the support substrate 5, the present invention can be applied to a transmission type of an electro-optical device and the like.

Also, it is possible to achieve a structure in which a thermally conductive film made of molybdenum, tungsten and the like is formed between the support substrate 5 and the insulation film 6 by a film formation method such as a sputtering method and the like. Such a structure can improve the temperature distribution on the support substrate 5 due to the thermally conductive film placed below the insulation film. For example, in the process of laminating the support substrate 5 and the semiconductor substrate 1 onto each other, this thermally conductive film can uniform the temperature distribution on the lamination boundary. Thus, the lamination on the boundary can be uniformed to thereby improve the lamination strength. Moreover, if it is applied to a transmission type of an electro-optical device and the like, this thermally conductive film can function as a light shield layer. By the way, the materials that can be used for this thermally conductive film other than those described above can include a high melting point metal, such as tantalum, cobalt, titanium or the like or an alloy including them, or silicide represented by poly-crystal silicon, tungsten silicide, molybdenum silicide and the like, as the desirable material. Also, as the film formation method, it is possible to employ the film formation methods, such as the CVD method, the electron beam evaporation method, and the like, besides the sputtering method.

Next, the member in which the semiconductor substrate 1 and the support substrate 5 have been laminated onto each other is annealed at a low temperature between 400° C. and 600° C. This thermal process enables the semiconductor substrate 1 to be easily separated at the positions of the ion implantation layers 1a and 1b, as shown in FIG. 1D. This phenomenon is brought about since the coupling of the semiconductor crystals constituting the semiconductor substrate 1 is disconnected by the ions implanted into the semiconductor substrate 1. This is further noticeable at the peak position of the ion concentration in the ion implantation layers 1a and 1b. Thus, the position separated by the thermal process is substantially equal to the peak position of the ion concentration. In this way, it is possible to obtain a semiconductor substrate 7 shown in FIG. 1E, in which the single crystal semiconductor layer 1c having the portions of the different thicknesses within the layer and the insulation film are formed on the support substrate 5. If the single crystal semiconductor layer 1c of this semiconductor substrate 7 has a film thickness of, for example, 200 nm, it is possible to obtain the uniform film thickness within 5%. By the way, the surface of the single crystal semiconductor layer 1c exposed by the separation has concave and convex portions of about several nm. Hence, it is desirable to smooth the surface of the single crystal semiconductor layer 1c by carrying out a touch polishing operation of a polish amount of 10 nm or less, or by using a hydrogen annealing method of carrying out a thermal process in hydrogen atmosphere.

By the above-mentioned processes, it is possible to manufacture the semiconductor substrate 7 having the single crystal semiconductor layer 1c in which the thicknesses are different depending on the portions. In this embodiment, the example is described in which one semiconductor substrate 7 is manufactured. In practice, however, the above-mentioned processes are done by using a large size of a manufacture support substrate through which a plurality of semiconductor substrates can be manufactured. Then, it is cut into individual semiconductor substrates after the semiconductor substrate is manufactured or after the semiconductor device is formed on the semiconductor substrate. The employment of such a manufacturing process makes it possible to achieve more efficient manufacturing process in which the variation in the product is small. Hence, it is possible to improve the yield.

According to the above-mentioned method of manufacturing the semiconductor substrate, it is possible to obtain a single crystal semiconductor layer similarly to the single crystal substrate so that it is of high quality and has very few defects, and thereby form a high speed device on the semiconductor substrate. In addition, to form the device on this single crystal semiconductor layer, the conventionally employed process for a single crystal substrate can be applied. Thus, the semiconductor device having the high performance can be formed without adding any new process. Hence, the employment of the method of manufacturing the semiconductor substrate according to the present invention can suppress the increase of the cost in the process of manufacturing the semiconductor device.

The semiconductor substrate can be manufactured by controlling the thickness of the single crystal semiconductor layer of the semiconductor substrate having the SOI structure at any position. Thus, for example, when the method of manufacturing the semiconductor substrate according to the present invention is applied to produce a liquid crystal device, it can be formed by respectively independently determining the thicknesses of the single crystal semiconductor layer in the region of the semiconductor substrate where pixels are formed and the region where a peripheral circuit is formed. That is, the single crystal semiconductor layer is thinly formed in the pixel formation region. Hence, the leak current can be reduced by suppressing the generation of a pair of an electron and a hole excited by light irradiation in the semiconductor device for driving the pixels. Also, the single crystal semiconductor layer is thickly formed in the region where peripheral drive circuit is formed. Therefore, the sheet resistance can be dropped, which is advantageous in forming a drive circuit driven at a large current or a high frequency.

Also, according to the above-mentioned method of manufacturing the semiconductor substrate, the thickness of the single crystal semiconductor layer can be freely adjusted in the ion implantation process. Thus, the number of processes can be reduced as compared with the method of thinning the layer thickness of the necessary portion after the formation of the single crystal semiconductor layer having the uniform thickness. Hence, it is possible to decrease the manufacturing cost of the semiconductor substrate having the SOI structure.

In this embodiment, as shown in FIG. 1B, the example is described in which the ion shield member 3 having the uniform thickness is formed on the insulation film 2. However, the shape of the outer end of the ion shield member 3 may be tapered toward the outermost end. If the ion shield member 3 having such a tapered shape is used, the boundary portion where the depth of the ion implantation layer 1a varies can be formed so that the thickness changes at a partly inclined angle rather than by a perpendicular step. That is, when the single crystal semiconductor substrate 1 is separated, there is no portion separated on the plane vertical to the surface of the semiconductor layer. Thus, it is easier to separate the single crystal semiconductor substrate 1. Hence, occurrence of defects at the time of the separation can be suppressed to thereby improve the yield of the product.

In the process shown in FIG. 1B, the ion shield member 3 can be used in which the thickness is different depending upon the portion. The usage of the ion shield member 3 having such a structure allows the ion implantation layer to be formed in which the thickness is different depending upon the portion and the shape is further complex. Thus, it is possible to form the single crystal semiconductor layer 1c having the further complex shape.

Also, after the ion is implanted through the ion shield member 3, by removing the ion shield member 3 and then implanting the ions again, it is also possible to change the depths of the ion implantation layers 1a and 1b. Even if any of the above-mentioned methods is used, according to the present invention, the depths of the ion implantation layers 1a and 1b can be controlled depending upon the portion.

In this embodiment, the method is described for controlling the layer thickness of the single crystal semiconductor layer. However, according to the present invention, it is possible to simultaneously control the shape within the plane of the single crystal semiconductor layer. That is, changing the shape within the plane of the ion shield member 3 shown in FIG. 1B can change the shape within the plane of the single crystal semiconductor layer 1c that is being formed. For example, resist is coated on the insulation film 2. Then, a resist pattern formed by patterning this resist is used as the ion shield member 3. Accordingly, it is possible to control the shape within the plane of the ion implantation layer.

Let us explain an actual example. When a TFT (Thin Film Transistor) is formed in the single crystal semiconductor layer, in order to form a source/drain region, it is necessary to pattern the semiconductor layer. However, according to the present invention, the semiconductor layer can be patterned in advance in a shape in which the source/drain region can be formed. So, it is possible to simplify the process of forming a semiconductor device, such as the TFT and the like, on the semiconductor layer. By the way, this process of patterning the ion shield member 3 can be done by using the known lithography technique and etching technique, even if a material except the resist is used as the ion shield member 3. If a plurality of materials are combined to form the ion shield member 3, it is possible to form a single crystal semiconductor layer 1c having a further complex shape.

(Liquid Crystal Device)

Figure 3:
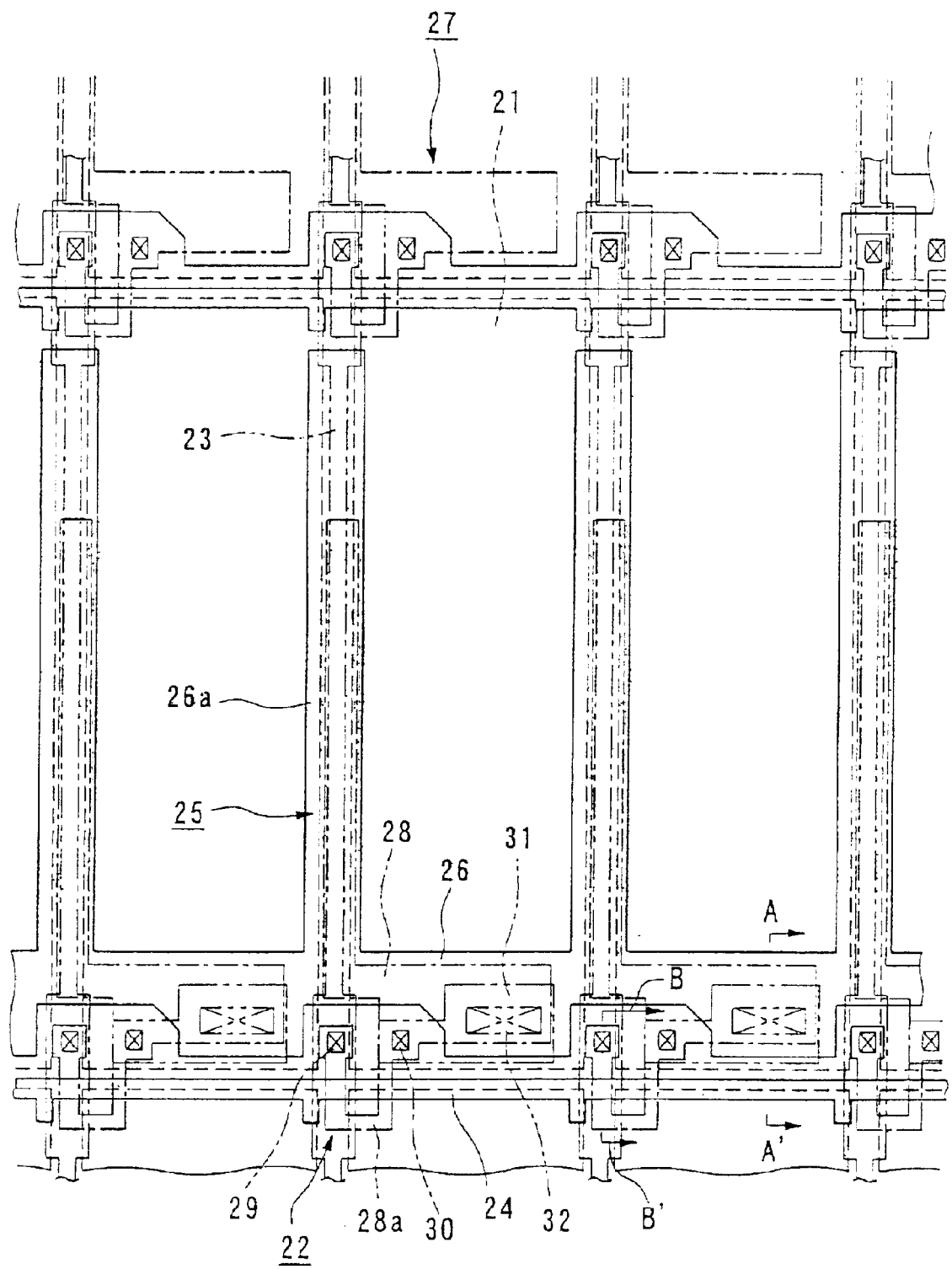
FIG. 3 is an enlarged plan view showing a pixel configuration of a liquid crystal apparatus according to the present invention.
Figure 4:
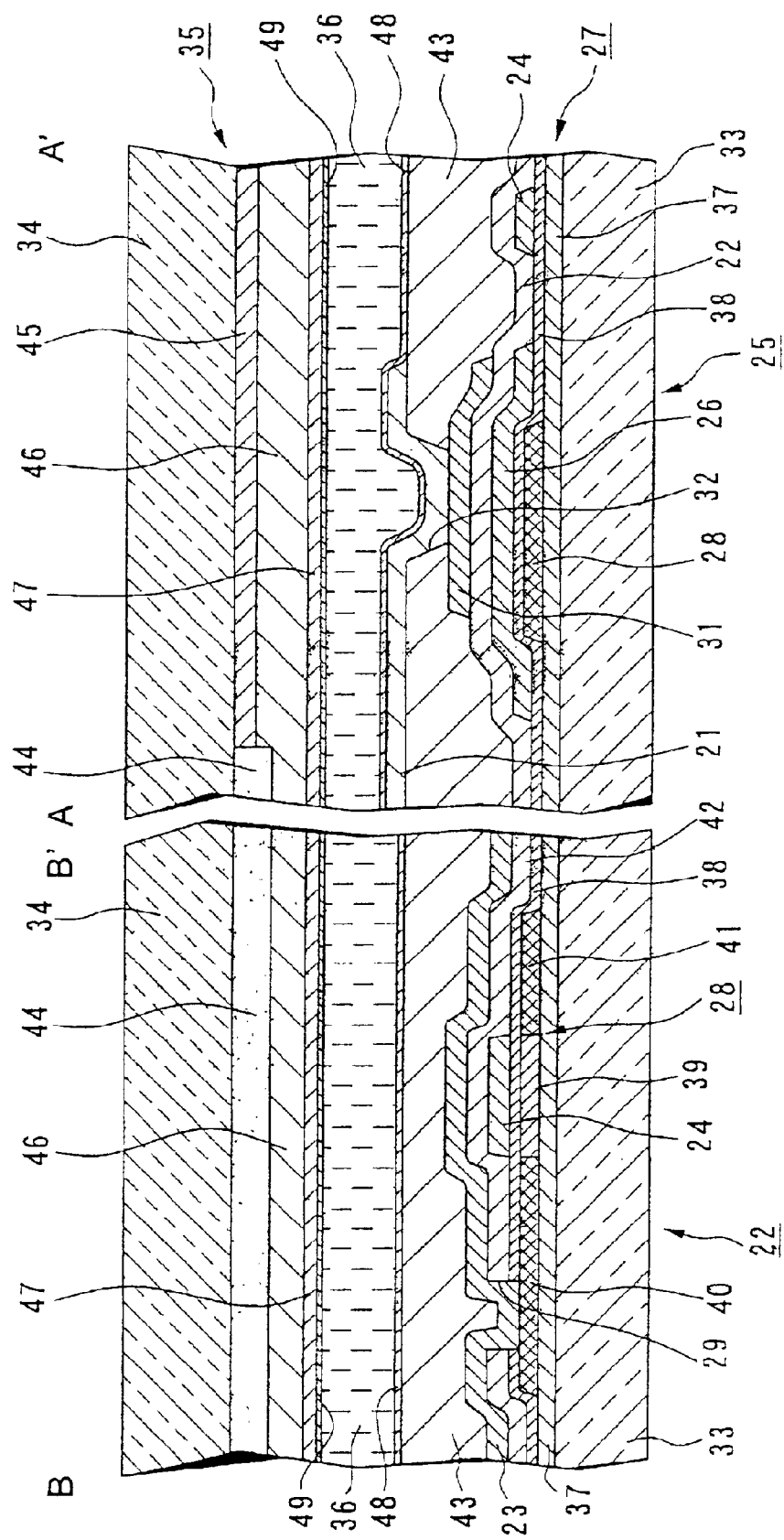
FIG. 4 is a sectional view along the A–A' line and the B–B' line of FIG. 3.
Figure 5:
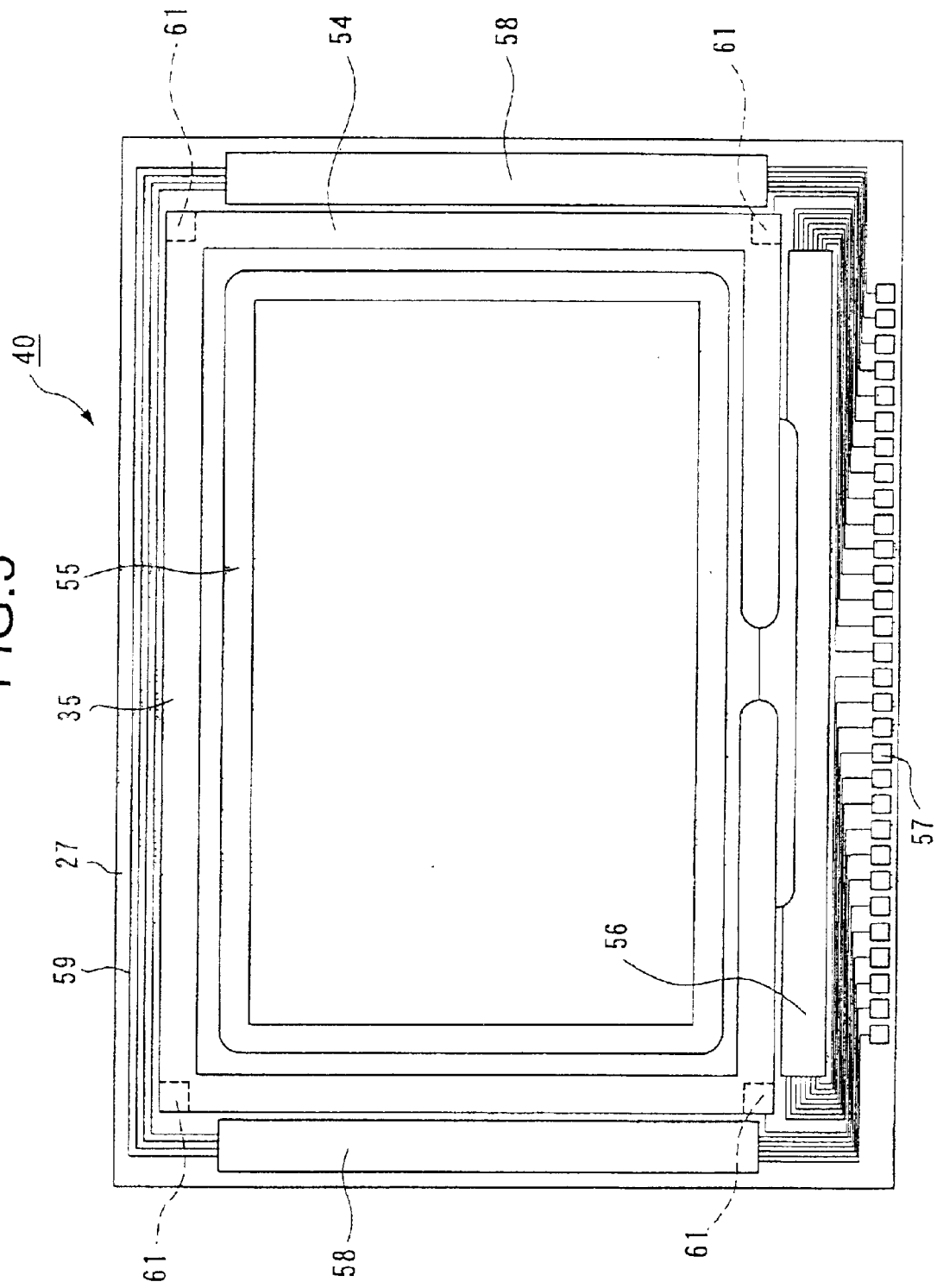
FIG. 5 is a plan view showing a whole configuration of a liquid crystal apparatus according to the present invention.
Figure 6:
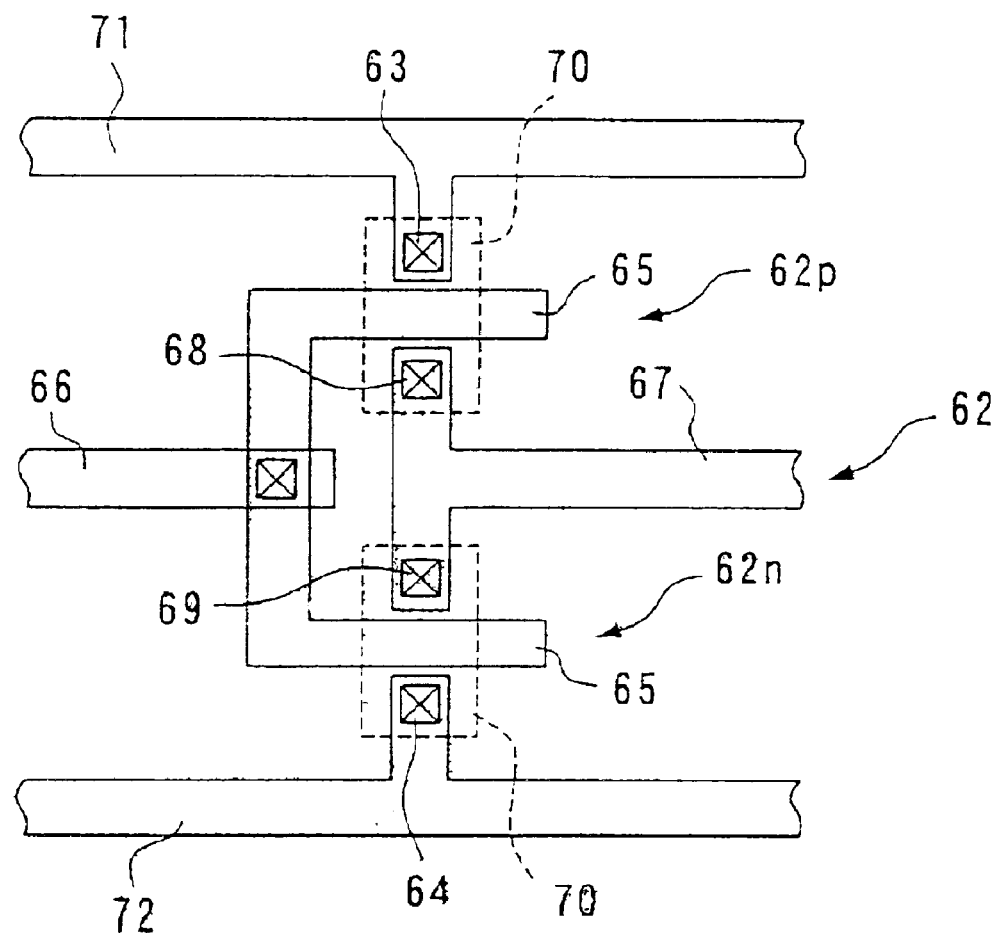
FIG. 6 is an enlarged plan view of a TFT used for a peripheral circuit of a liquid crystal apparatus according to the present invention.

A liquid crystal device as a preferable example of the electro-optical device using the semiconductor substrate manufactured by the method of manufacturing the semiconductor substrate according to the present invention will be described below with reference to FIG. 2 to FIG. 7. FIG. 2 is an equivalent circuit of various elements, wiring and the like, in a plurality of pixels constituting an image display region of the liquid crystal device in this example. FIG. 3 is a plan view showing a plurality of pixel groups adjacent to each other on a TFT array substrate on which data lines, scanning lines, pixel electrodes and the like are formed together with the TFT as an example of a first switching element. The left side of FIG. 4 is a sectional view along the line B–B' of FIG. 3 showing the TFT portion, and the right side of FIG. 4 is a sectional view along the line A–A' of FIG. 3 showing a storage capacitor. FIG. 5 is a plan view when a TFT array substrate 27 is seen from a side of an opposite substrate 35 together with respective components formed on the TFT array substrate 27. FIG. 6 is a plan view showing the configuration of the TFT constituting the peripheral circuit, such as the drive circuit or the like, as an example of a second switching element. By the way, in the following respective drawings, the scale is different for each layer and each member, in order to illustrate each layer and each member in the size that can be recognized on the drawing.

As shown in FIG. 2, in the plurality of pixels arranged in a form of matrix for constituting the image display region of the liquid crystal device in this example, pixel electrodes 21 and TFTs 22 serving as the first switching element for controlling the pixel electrodes 21 are formed in a form of matrix, and data lines (signal lines) 23 are electrically connected to source regions of the TFTs 22. Image signals S1, S2 to Sn written to the data lines 23 may be sent sequentially in this order, or may be simultaneously sent to the plurality of data lines 23 adjacent to each other for each group. Also, scanning lines 24 (signal lines) are electrically connected to gate electrodes of the TFTs 22. It is designed to apply scanning signals G1, G2 to Gm as pulses to the scanning lines 24 in turn in this order at a predetermined timing. The pixel electrodes 21 are electrically connected to drain regions of the TFTs 22. Then, by closing the switch of the TFTs 22 serving as the (first) switching element for a certain period of time, the image signals S1, S2 to Sn sent on the data lines 23 are written to the liquid crystals at a predetermined timing.

The image signals S1, S2 to Sn of a predetermined level written to the liquid crystals through the pixel electrodes 21 are kept for a certain period between an opposite electrodes (described later) formed on an opposite substrate (described later) and the pixel electrodes 21. Here, in order to protect the kept image signals from leaking, a storage capacitor portion 25 is added in parallel to liquid crystal capacitor generated between the pixel electrode 21 and the opposite electrode. There is a capacitor line 26 corresponding to a gate line of a MOS transistor that forms the storage capacitor. This storage capacitor portion 25 enables a voltage of the pixel electrode 21 to be held for a time longer by three digits than a time of an application of a source voltage. Thus, the holding property can be further improved to thereby attain the liquid crystal device having a high contrast ratio.

By the way, as the method of forming the storage capacitor portion, the capacitor may be formed by using the scanning lines 24 at the former stage, instead of the installation of the capacitor lines 26.

As shown in FIG. 3, on the TFT array substrate 27 serving as one substrate of the liquid crystal device, the plurality of pixel electrodes 21 (the contour is represented by a broken line) made of transparent conductive film such as indium tin oxide (ITO) and the like are arranged in the form of matrix, and the data lines 23 (the contour is represented by a two-dot chain line) are arranged along the sides of the pixel electrodes 21 extending in the longitudinal direction in the drawing, and the scanning lines 24 and the capacitor lines 26 (both contours are represented by solid lines) are arranged along the sides extending in the lateral direction in the drawing. In the liquid crystal device of this example, a semiconductor layer 28 (the contour is represented by a one-dot chain line) made of a single crystal silicon layer is formed in a U shape near the crossing of the data line 23 and the scanning line 24, and one end of the U-shaped portion 28a extends long in the direction of the adjacent data line 23 (to the right in the drawing) and in a direction along the data line 23 (an upward direction in the drawing). Contact holes 29 and 30 are made on both ends of the U-shaped portion 28a of the semiconductor layer 28. One contact hole 29 functions as a source contact hole through which a source region of the semiconductor layer 28 and the data line 23 are electrically connected to each other, and the other contact hole 30 functions as a drain contact hole through which a drain region of the semiconductor layer 28 and a drain electrode 31 (the contour is represented by a two-dot chain line) are electrically connected to each other. A pixel contact hole 32, through which the pixel electrode 21 and the drain electrode 31 are electrically connected to each other, is formed at an end of the drain electrode 31, on the side thereof where the drain contact hole 30 is made.

The TFT 22 in this example shown in FIG. 3 is a p-channel type TFT. The U-shaped portion 28a of the semiconductor layer 28 crosses the scanning line 24, and the semiconductor layer 28 and the scanning line 24 cross each other two times. Thus, this constitutes the TFT having two gates on one semiconductor layer, namely, a so-called "dual gate TFT". Also, the capacitor line 26 extends so as to penetrate the pixels aligned in the lateral direction along the scanning line 24 in the drawing. The storage capacitor portion 25 is constituted by the capacitor line 26 and the semiconductor layer 28 in which the branched portion 26a of the capacitor line 26 extends along the data line 23.

The liquid crystal device in this example has a pair of transparent substrates 33 and 34 as shown in FIG. 4, and has the TFT array substrate 27 serving as one substrate thereof and the opposite substrate 35 serving as the other substrate arranged opposite to the TFT array substrate 27. Liquid crystal 36 is sandwiched between those substrates 27 and 35. The transparent substrates 33 and 34 are made of, for example, glass substrate or quartz substrate.

In the TFT portion shown on the left side of FIG. 4, an underlying insulation film 37 is formed on the TFT array substrate 27, a semiconductor layer 28 made of a single crystal silicon layer having a film thickness of, for example, about 50 nm is formed on the underlying insulation film 37, and an insulation thin film 38 serving as a gate insulation film having a film thickness of about 50 to 150 nm is formed so as to cover the entire surface of this semiconductor layer 28. The TFT 22 for performing a switching control on each pixel electrode 21 is formed on the underlying insulation film 37. The TFT 22 is provided with: a scanning line 24 made of polycrystalline silicon and the like; a channel region 39 of the semiconductor layer 28 in which a channel is formed by an electric field from the scanning line 24; the insulation thin film 38 serving as a gate insulation film for insulating the scanning line 24 from the semiconductor layer 28; a data line 23 made of metal such as aluminum and the like; and a source region 40 and a drain region 41 of the semiconductor layer 28.

In the portion of the storage capacitor portion 25 shown on the right side of FIG.4, the underlying insulation film 37 is formed on the TFT array substrate 27, the semiconductor layer 28 is placed on the underlying insulation film 37, and the insulation thin film 38 (dielectric film) is formed so as to cover the entire surface of this semiconductor layer 28. The capacitor line 26 made of the metal of the same layer as the scanning line 24 is formed on the insulation thin film 38, and a first interlayer insulation film 42 is formed so as to cover the entire surface of the capacitor line 26. The drain electrode 31 is formed on the first interlayer insulation film 42. Then, the pixel contact hole 32 is made which penetrates a second interlayer insulation film 43 and reaches the surface of the drain electrode 31. The pixel electrode 21 made of a transparent conductive film such as ITO and the like is placed which is electrically connected to the drain electrode 31 in the portion of the pixel contact hole 32. By the way, the second interlayer insulation film 43 is used as a leveling film. For example, acrylic film that is one kind of resin film having high flatness is thickly formed at a thickness of about 2 $\mu$m.

On the other hand, a first light shields film 44 (black matrix) made of, for example, metallic film such as chrome and the like, resin black resist and the like, is formed in a form of grid on the opposite substrate 35. A color filter layer 45 corresponding to three primary colors of R (Red), G (Green) and B (Blue) is formed between the formation regions of the first light shield film 44. An overcoat film 46 is formed so as to cover the color filter layer 45. And on the overcoat film 46, an opposite electrode 47 made of transparent conductive film such as ITO, similarly to the pixel electrode 21, is formed on the entire surface. By the way, alignment films 48 and 49 made of polyimide and the like are respectively placed on the surfaces of the TFT array substrate 27 and the opposite substrate 35, which are both in contact with the liquid crystal 36.

In FIG. 5, on the TFT array substrate 27, a seal member 54 is disposed along an edge thereof. A periphery parting area 55 made of light shield material is provided in parallel to the inside of the seal member 54. In a region outside the seal member 54, data line drive circuits 56 and mount terminals 57 are placed along one side of the TFT array substrate 27. Scanning line drive circuits 58 are placed along two sides adjacent to the above-mentioned one side. If the delay of a scanning signal sent to the scanning line does not cause any problems, it is needless to say that the scanning line drive circuit 58 may be mounted on only one side. Also, the data line drive circuit 56 may be mounted on both sides along a side of an image display region. For example, odd-numbered data lines may send image signals from the data line drive circuit arranged along one side of the image display region, and even-numbered data lines may send image signals from the data line drive circuit arranged on the opposite side of the image display region. If the data lines 23 are driven in a form of comb teeth as mentioned above, it is possible to expand an area occupied by the data line drive circuits, and thereby possible to configure a complex circuit. Moreover, a plurality of wirings 59 to connect between the scanning line drive circuits 58 mounted on both sides of the image display region. Also, an upper lower conductive member 61 for establishing an electrical conductivity between the TFT array substrate 27 and the opposite substrate 35 is mounted in at least one portion of a corner of the opposite substrate 35. Then, the opposite substrate 35 having the contour substantially equal to that of the seal member 54 is fixed to the TFT array substrate 27 through the seal member 54.

FIG. 6 is a plan view showing a TFT configuration as an example of the second switching element constituting the peripheral circuits such as the scanning line drive circuit 58 or the data line drive circuit 56 shown in FIG. 5 or the like. In FIG. 6, the TFT constituting the peripheral circuit is configured as a complementary TFT 62 composed of a p-channel type TFT 62p and an n-channel type TFT 62n. A semiconductor layer 70 (whose contour is represented by a dotted line) constituting the TFT 62p and the TFT 62n is formed in the form of an island via the underlying insulation film 37 formed on the substrate. The channel region and the like are formed on this semiconductor layer 70. In the TFT 62p and the TFT 62n, a high potential line 71 and a low potential line 72 are respectively electrically connected to source regions formed on the semiconductor layers 70 through contact holes 63 and 64. An input wiring 66 is connected to gate electrodes, respectively. And, an output wiring 67 is electrically connected to drain regions formed on the semiconductor layers 70 through contact holes 68 and 69, respectively.

The liquid crystal device having the above-mentioned structure uses the TFT array substrate 27 in which the layer thickness of the semiconductor layer 28 of the TFT 22 constituting the pixel shown in FIG. 3 and FIG. 4 is thinner than that of the semiconductor layer 70 of the TFT 62 constituting the data line drive circuit 56 and the scanning line drive circuit 58 shown in FIG. 5. Thus, in the semiconductor layer 28 of the pixel, the generation amount of the pair of electron and hole resulting from the irradiation of external light can be reduced to thereby protect the erroneous operation caused by the leak current and the like. Also, in the semiconductor layer 70 of the drive circuits 56 and 58, the semiconductor layer is thick to thereby decrease the sheet resistance. Hence, the drive circuits 56 and 58 can be driven at the large current and the high frequency to thereby provide the liquid crystal device having the higher performance.

The semiconductor substrate according to the present invention is applied to the above-mentioned liquid crystal device. However, it is also possible to use the semiconductor substrate having the structure in which a thermally conductive film is inserted between the above-mentioned support substrate and the insulation film. If the liquid crystal device is formed by using the semiconductor substrate having such a structure, for example, the heat generated from the drive circuits 56 and 58 driven at the large current and the high frequency can be effectively discharged to the thermally conductive film. Thus, the erroneous operation can be prevented to thereby provide the liquid crystal device having the higher reliability. Also, since the thermally conductive film is made of the light shield material, the generation of the light leak current caused by the irradiation of external light to the semiconductor device constituting the drive circuit and the pixel can be reduced or prevented to thereby provide the liquid crystal device having much higher reliability.

An inspection circuit for inspecting the quality, defects and the like of the liquid crystal device during the manufacturing process or the shipment may be formed on the TFT array substrate 27 of the liquid crystal device. Also, a polarization film, a retardation film, a polarization device and the like are arranged in predetermined directions on the side to which a projection light of the opposite substrate 35 is inputted and the side from which an output light of the TFT array substrate 27 is outputted, respectively depending upon the operation modes, such as a TN (Twin stage nematic) mode, an STN (Super TN) mode, a D-STN (Dual Scan—STN) mode and the like, and the kind of a normally white mode/normally black mode.

When the above-mentioned liquid crystal device is applied to, for example, a color liquid crystal projector (projection type display), three liquid crystal devices are used as light valves for R, G and B, respectively. Light of the respective colors decomposed through respective dichroic mirrors for RGB decomposition are inputted to respective panels as projection light, respectively. Thus, in this case, as described in the above-mentioned embodiments, the color filter is not disposed on the opposite substrate 35. However, the RGB color filters together with their protection films may be formed in predetermined regions opposite to the pixel electrode in the opposite substrate 35. Such a structure enables the liquid crystal devices in the respective embodiments to be applied to a color liquid crystal device for a direct view type or a reflection type of a color liquid crystal television other than the liquid crystal projector. Moreover, micro lenses may be mounted on the opposite substrate 35 so that one micro lens corresponds to one pixel. Such a structure can improve the incident light condensing efficiency. Thus, it is possible to attain the bright liquid crystal device. Furthermore, a plurality of interference layers whose refractive indexes are different from each other may be deposited on the opposite substrate 35 so that the dichroic filters for making the RGB colors may be formed by using the interference of the light. The usage of the opposite substrate with the dichroic filters makes it possible to attain much brighter color liquid crystal devices.

(Electronic Equipment)

The liquid crystal device of the present invention can be used in various electronic equipment.

Figure 7:
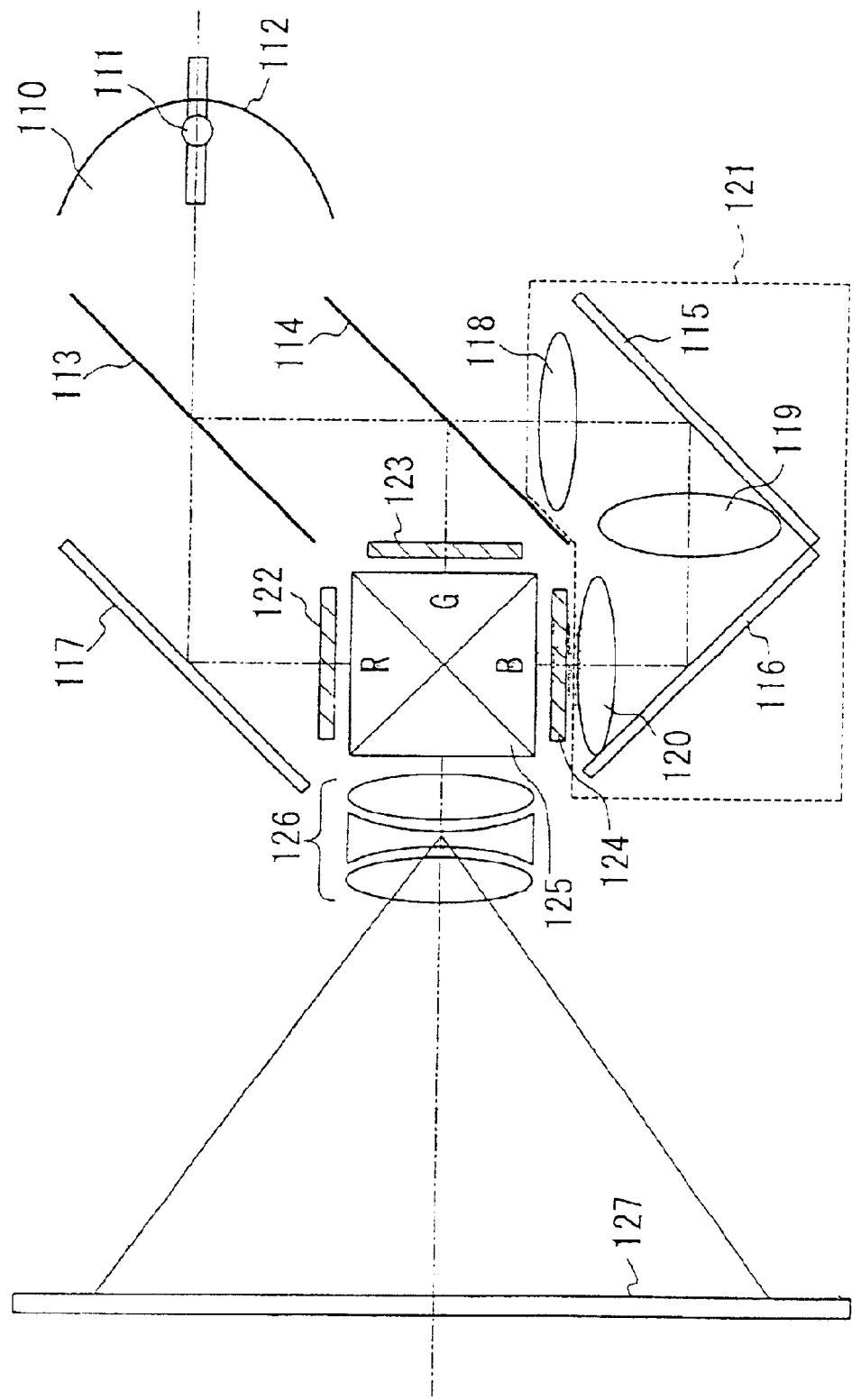
FIG. 7 is a block diagram showing a configuration example of a projection type display which is an electronic equipment using a liquid crystal apparatus according to the present invention.

As an example of electronic equipment having such a structure, there is a liquid crystal projector shown in FIG. 7. Or, there are a portable telephone, a word processor, a television, a view finder type or a monitor direct view type of a video tape recorder, an electronic memo, an electronic table type computer, a car navigation apparatus, a POS terminal, an apparatus having a touch panel, and so on.

FIG. 7 is a schematic block diagram showing the main portion of the projection type display. In FIG. 7, the projection type display is provided with: a light source 110; dichroic mirrors 113 and 114; reflection mirrors 115, 116 and 117; relay lenses 118, 119 and 120; liquid crystal light valves 122, 123 and 124 using the liquid crystal devices according to the present invention; a cross dichroic prism 125; and a projection lens 126. The light source 110 is provided with a lamp 111 such as a metal halide and the like, and a reflector 112 for reflecting the light of the lamp. The dichroic mirror 113 for reflecting blue light and green light transmits red light in a white light beam from the light source 110, and reflects the blue light and the green light. The transmitted red light is reflected by the reflection mirror 117, and inputted to the liquid crystal light valve 122 for red light. On the other hand, the green light in the light reflected by the dichroic mirror 113 is reflected by the dichroic mirror 114 for reflecting the green light, and inputted to the liquid crystal light valve 123 for green light. On the other hand, the blue light is also transmitted through the second dichroic mirror 114. A light guide device 121 composed of a relay lens system containing the input lens 118, the relay lens 119 and the output lens 120 is mounted for the blue light, in order to prevent an optical loss caused by a long light path. Then, the blue light is inputted through the light guide device 121 to the liquid crystal light valve 124 for blue light.

Three colors of light modulated by the respective light valves are inputted to the cross dichroic prism 125. This prism is configured such that four right-angle prisms are laminated to each other and a dielectric multi-layer film for reflecting the red light and a dielectric multi-layer film for reflecting the blue light are formed on the inner side in a cross-shaped manner. Three colors of light are synthesized by those dielectric multi-layer films to thereby generate light representative of a color image. The synthesized light is projected onto a screen 127 by a projection lens 126 serving as a projecting optical system, and the image is enlarged and displayed. The liquid crystal device according to the present invention is used in each liquid crystal light valve.

As detailed above, according to the method of manufacturing the semiconductor substrate in the present invention, it is possible to obtain the semiconductor substrate in which the thicknesses of the single crystal semiconductor layers are different within the layer.

Also, according to the present invention, it is possible to obtain the liquid crystal device to which the above-mentioned method of manufacturing the semiconductor substrate is applied.

Also, according to the present invention, it is possible to obtain the electronic equipment to which the above-mentioned liquid crystal device is applied.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No.2000-315822 filed on Oct. 16, 2000 including the specification, claims, drawings and summary is incorporated herein by reference in its entirety.

What is claimed is:

1. A method of manufacturing a semiconductor substrate comprising the processes of:

forming an insulation film on at least a surface of a semiconductor substrate main body;

forming an ion shield member having a predetermined shape on said insulation film;

subsequent to forming the insulation film, implanting ions into said semiconductor substrate main body from a side on which said insulation film is formed, to thereby form an ion implantation layer;

removing said ion shield member;

cleaning or smoothing the surface of said insulation film;

laminating said insulation film and a support substrate onto each other; and separating a portion of said semiconductor substrate main body from said support substrate along said ion implantation layer, wherein a shape of an outer edge of said ion shield member is tapered, and thereby said ion implantation layer is partly inclined in response to said tapered shape of the outer edge of said ion shield member, so as to prevent separation defect in remaining portion of the semiconductor substrate main body on said support substrate.

2. A method of manufacturing a semiconductor substrate according to claim 1, wherein the process of separating said portion of said semiconductor substrate main body along said ion implantation layer comprises the process of separating said portion of said semiconductor substrate main body at a peak position of an ion concentration in said ion implantation layer.

3. A method of manufacturing a semiconductor substrate according to claim 1, wherein the process of forming said ion shield member comprises the processes of: forming an ion shield film made of a resist or an oxide film on said insulation film; and patterning said ion shield film to a predetermined shape to thereby form said ion shield member.

4. A method of manufacturing a semiconductor substrate according to claim 1, wherein a thermally conductive film is buried in the support substrate used in the laminating process.

5. A method of manufacturing a semiconductor substrate for an electro-optical apparatus, comprising the processes of:

forming an insulation film on a surface of a semiconductor substrate main body;

forming an ion shield member having a predetermined shape on said insulation film;

subsequent to forming the insulation film, implanting ions into said semiconductor substrate main body from a side on which said insulation film is formed, to thereby form an ion implantation layer;

removing said ion shield member;

cleaning or smoothing the surface of said insulation film;

laminating said insulation film and a support substrate onto each other; and separating a portion of said semiconductor substrate main body from said support substrate along said ion implantation layer in a condition that a thickness of a first remaining portion of the semiconductor substrate main body that is designed to form a drive circuit of the electro-optical apparatus is thick and a thickness of a second remaining portion of the semiconductor substrate main body that is designed to form an image display region of the electro-optical apparatus is thinner, wherein a shape of an outer edge of said ion shield member is tapered, and thereby said ion implantation layer is partly inclined in response to said tapered shape of the outer edge of said ion shield member, so as to prevent separation defect in the first and second remaining portions of said semiconductor substrate main body on said support substrate.

* * * * *